(12) United States Patent
Zucker et al.

(10) Patent No.: US 7,898,336 B2
(45) Date of Patent: *Mar. 1, 2011

(54) GROUND SKIMMING OUTPUT STAGE

(75) Inventors: Robert David Zucker, Los Altos, CA (US); Barry Harvey, Los Altos, CA (US)

(73) Assignee: D2Audio Corporation, Milpitas, CA (US)

( * ) Notice: Subject to any disclaimer, the term of this patent is extended or adjusted under 35 U.S.C. 154(b) by 126 days.

This patent is subject to a terminal disclaimer.

(21) Appl. No.: 12/325,448

(22) Filed: Dec. 1, 2008

(65) Prior Publication Data

US 2009/0079505 A1 Mar. 26, 2009

Related U.S. Application Data

(63) Continuation of application No. 11/234,010, filed on Sep. 23, 2005, now Pat. No. 7,459,978.

(60) Provisional application No. 60/612,556, filed on Sep. 23, 2004.

(51) Int. Cl.
   *H03F 3/04* (2006.01)

(52) U.S. Cl. .................. 330/290; 330/296; 330/297; 327/574; 381/120

(58) Field of Classification Search ............ 330/288, 330/290, 277, 296, 297; 327/574, 581, 583, 327/560, 562; 381/120, 121
See application file for complete search history.

(56) References Cited

U.S. PATENT DOCUMENTS 5,451,903 A  9/1995 Armstrong 6,434,243 B1 * 8/2002 Read .......................... 381/120

OTHER PUBLICATIONS

Todd, "FET's as Voltage-Variable," Application Note, vol. 113, No. 19, Sep. 13, 1965, pp. 66-68.
Fei, L., "Translinear Circuits Tackle RF Signals," Penton Media, Inc., http://www.mwrf.com/Articles/ArticleID/21231/21231.html, pp. 1-4, May 2009.
Gilbert, B., "Translinear Circuits: A Proposed Classification," Analog Devices, Inc., pp. 14-16, Dec. 9, 1974.
Vargas-Bernal, R., "Identifying Translinear Loops in the Circuit Topology," IEEE, 4 pages, May 2000.
"Translinear Circuit;" Wikipedia, http://en.wikipedia.org/wiki/Translinear_circuit, accesses Oct. 12, 2010.
Seevinick, E., "Generalized Translinear Circuit Principle," IEEE, vol. 26, No. 8, Aug. 1991.
"Translinear Circuits," Wiley Encyclopedia of Electrical and Electronics Engineering, J. Webster (ed.), John Wiley & Sons, Inc., 1999.

* cited by examiner

*Primary Examiner*—Michael B Shingleton
(74) *Attorney, Agent, or Firm*—Fliesler Meyer LLP

(57) ABSTRACT

Ground skimming output stages that are designed to drive wideband signals with the ability to provide a high quality output signal all the way to the low supply rail are provided. In accordance with an embodiment of the present invention, the output stage of the present invention includes a translinear current controller, an output transistor and a current mirror. While not limited thereto, embodiments of the present invention only require a single positive power supply, consistent with the recent trend toward integrated circuits that only require a single low voltage power supply.

21 Claims, 5 Drawing Sheets

GROUND SKIMMING OUTPUT STAGE

PRIORITY CLAIM

This application is a continuation of U.S. patent application Ser. No. 11/234,010, filed Sep. 23, 2005 (which will issue as U.S. Pat. No. 7,459,978), which claims priority under 35 U.S.C. 119(e) to U.S. Provisional Patent Application No. 60/612,556, filed Sep. 23, 2004, each of which is incorporated herein by reference.

FIELD OF THE INVENTION

Embodiments of the present invention relate to the field of integrated circuits, and more specifically to output stages, e.g., for driving loads.

BACKGROUND

Traditional AB output stages typically do not allow the output voltage to substantially go to zero volts. More specifically, most output stages include a pair of complimentary emitter follower transistors that are biased so that there is some overlap, with an emitter follower of an N-type on the top side and an emitter follower of a P-type on the bottom side. In this arrangement, the output can only go within $V_{BE}$ of the upper voltage rail and down to $V_{BE}$ above the lower voltage rail. Thus, if the lower voltage rail is ground, as is often the case in circuits powered by a single power supply, the output can only go as low as about 0.7V. This, however, is not convenient for a video circuit where it is may be desirable to allow the output to approach ground.

SUMMARY OF THE PRESENT INVENTION

Embodiments of the present invention are directed to output stages that are designed to drive wideband signals with the ability to provide a high quality output signal substantially all the way to the lower supply rail (e.g., ground). In accordance with an embodiment of the present invention, the output stage of the present invention only requires a single positive power supply, consistent with the recent trend toward integrated circuits which only require a single low voltage power supply.

In accordance with an embodiment of the present invention, an output stage includes a translinear current controller, an output transistor and a current mirror. The translinear current controller is connected to a first voltage rail and includes first and second inputs, and an output. The output transistor includes a control terminal (e.g., a base or a gate) that forms an input of the output stage, an emitter (or source) that forms an output of the output stage, and a collector (or drain). The current mirror is connected to a second voltage rail and includes an input and an output. The first input of the translinear current controller is connected to a bias current source. The output of the translinear current controller is connected to the input of the current mirror. The second input of the translinear current controller is connected to the collector (or drain) of the output transistor. The emitter (or source) of the output transistor is connected to the output of the current mirror.

Further and alternative embodiments and details, and the features, aspects, and advantages of the present invention will become more apparent from the detailed description set forth below, the drawings and the claims.

DETAILED DESCRIPTION

Embodiments of the present invention are directed to output stages, which while not limited thereto, are especially useful for driving video loads. In accordance with an embodiment of the present invention, the output stage is designed to drive wideband signals with the ability to provide a high quality output signal substantially all the way to the lower supply rail (e.g., ground). In accordance with an embodiment of the present invention, the output stage of the present invention only requires a single positive power supply (e.g., 3V), consistent with the recent trend toward integrated circuits that only require a single low voltage power supply. In such an embodiment, the lower supply rail is ground, and the output signal can substantially approach ground. Thus, the output stage can be referred to as "ground skimming."

The output stage, according to embodiments of the present invention, can quickly follow a video signal to within a few mV of ground. When the input signal rises back up, the output stage releases from ground quickly with negligible recovery artifacts.

While not limited to this use, the output stage of the present invention can be incorporated inside a compound amplifier stage which uses feed-back from the output to improve linearity.

In accordance with an embodiment of the present invention, an output stage in accordance with the present invention can replace conventional emitter-followers of an operational amplifier, which are typically biased to either class-AB or class-A.

In accordance with embodiments of the present invention, the output stage implements a class-AB emitter-follower function with improved performance. This is accomplished using a unique translinear current controller, which is one of the ways the output stage of the present invention differs from previous implementations which were subject to extreme instabilities, rendering them impractical. Previous attempts to build such a circuit have failed to be practical because they did not use the translinear biasing method of the present invention, rendering them unstable.

Figure 1A:
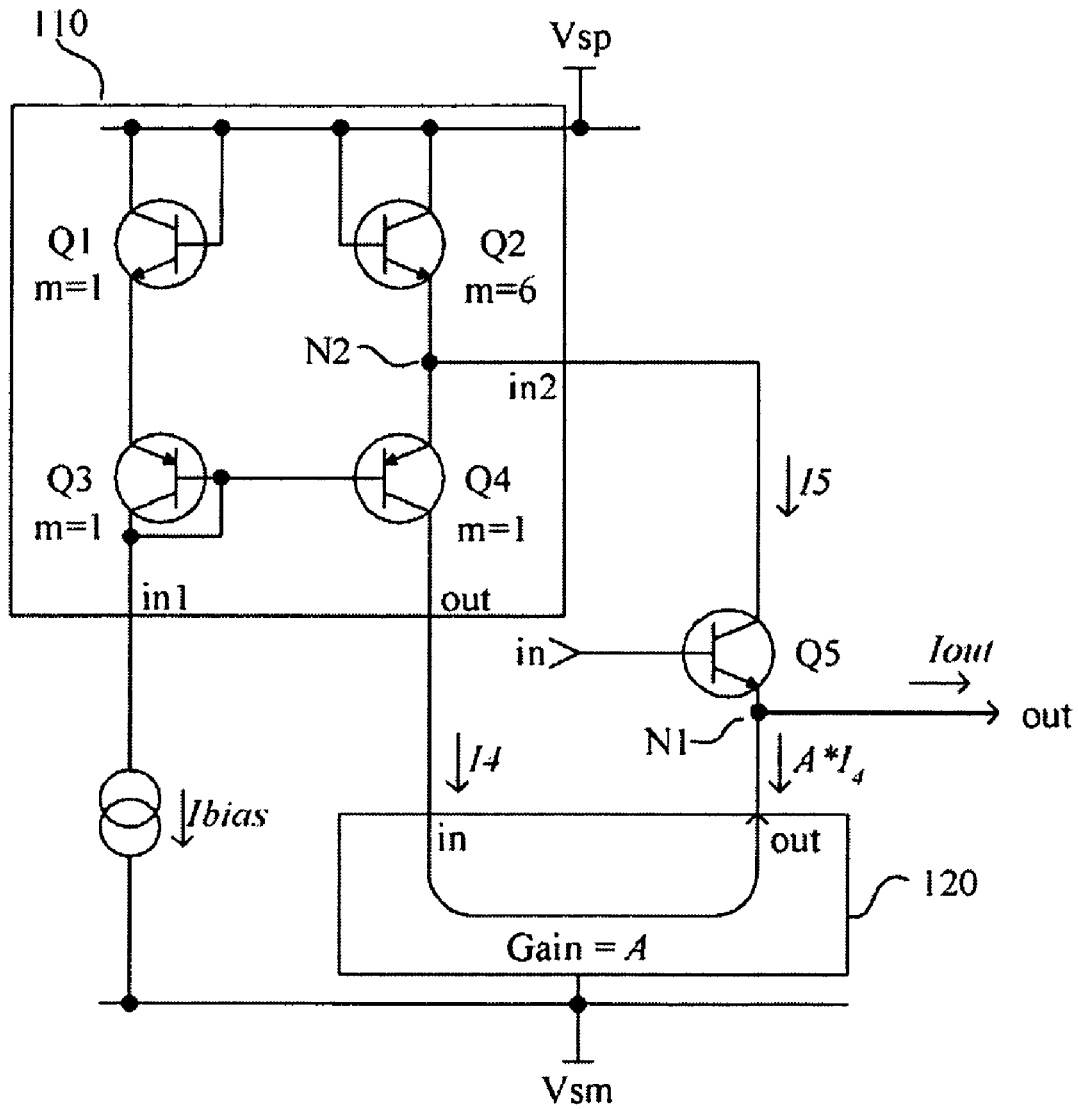
FIGS. 1A, 1B and 1C are circuit diagrams of output stages according to various embodiments of the present invention.

FIG. 1A is a circuit diagram of an output stage 102 according to an embodiment of the present invention. In accordance with an embodiment of the present invention, the output stage includes a translinear current controller 110, an output transistor Q5 and a current mirror 120.

In accordance with an embodiment of the present invention, the translinear current controller 110 includes bipolar transistors Q1, Q2, Q3 and Q4, with transistors Q1, Q2 and Q3 being diode connected. NPN transistor Q1 and PNP transistor Q3 form an input leg of the translinear current controller 110. Similarly, NPN transistor Q2 and PNP transistor Q4 form an output leg of the translinear current controller 110. The base and collector of NPN transistor Q1 are connected together to a supply voltage rail Vsp (e.g., 3V, 3.5V or 5.0V). Similarly, the base and collector of NPN transistor Q2 are connected together to the supply voltage rail Vsp. The base and collector of PNP transistor Q3 are connected together, and the base of PNP transistor Q3 is connected to the base of PNP transistor Q4. In this arrangement, the collector of transistor Q3 forms a first input (in1) of the translinear current controller 110, the collector of transistor Q4 forms the output (out) of the translinear current controller 110, and the emitters of NPN transistor Q2 and PNP transistor Q4 form a second input (in2) of the translinear current controller 110.

The output current of the translinear current controller 110, which is labeled I4 (since it is the current at the collector of transistor Q4), is provided to the input of the current mirror 120. The current mirror 120 has a gain of A, resulting in the current at the output of the current mirror 120 being A*I4. The output of the current mirror 120 is connected to the output of the output stage 120, labeled node (N1). The current mirror 120 can be made of bipolar or MOS devices, with similar results.

The base of the output transistor Q5 forms the input of the output stage 102. The collector of the output transistor Q5 is connected to the second input (in2), i.e., node (N2), of the translinear current controller 110. The emitter of the output transistor Q5 forms the output node (N1) of the output stage 102. The output node (N1) will typically be connected to a load that may or may not be AC coupled. If AC coupled, the output stage 102 should draw current from the output load capacitance when the output slews negative, and should push current into the output load capacitance when the output slews positive. More specifically, when a current is pushed into or pulled from the output node (N1), the current through transistor Q5 should be kept relatively constant so that the output stage functions accurately. Otherwise, if the current through transistor Q5 becomes too low, the bandwidth of the output stage 102 will die off.

The general solution to the circuit of FIG. 1 is shown below:

$$Ibias^2 * \left(\frac{Is2 * Is4}{Is1 * Is3}\right) = \qquad \text{(Equation 1)}$$

$$\frac{I5^2}{A} * \left(1 + \frac{1}{A}\right) - \frac{I5 * Iout}{A} * \left(1 + \frac{2}{A}\right) + \frac{Iout^2}{A^2}$$

where, Is1, Is2, Is3 and Is4 are constants relating to the area and process of transistors Q1, Q2, Q3 and Q4.

Figure 2:
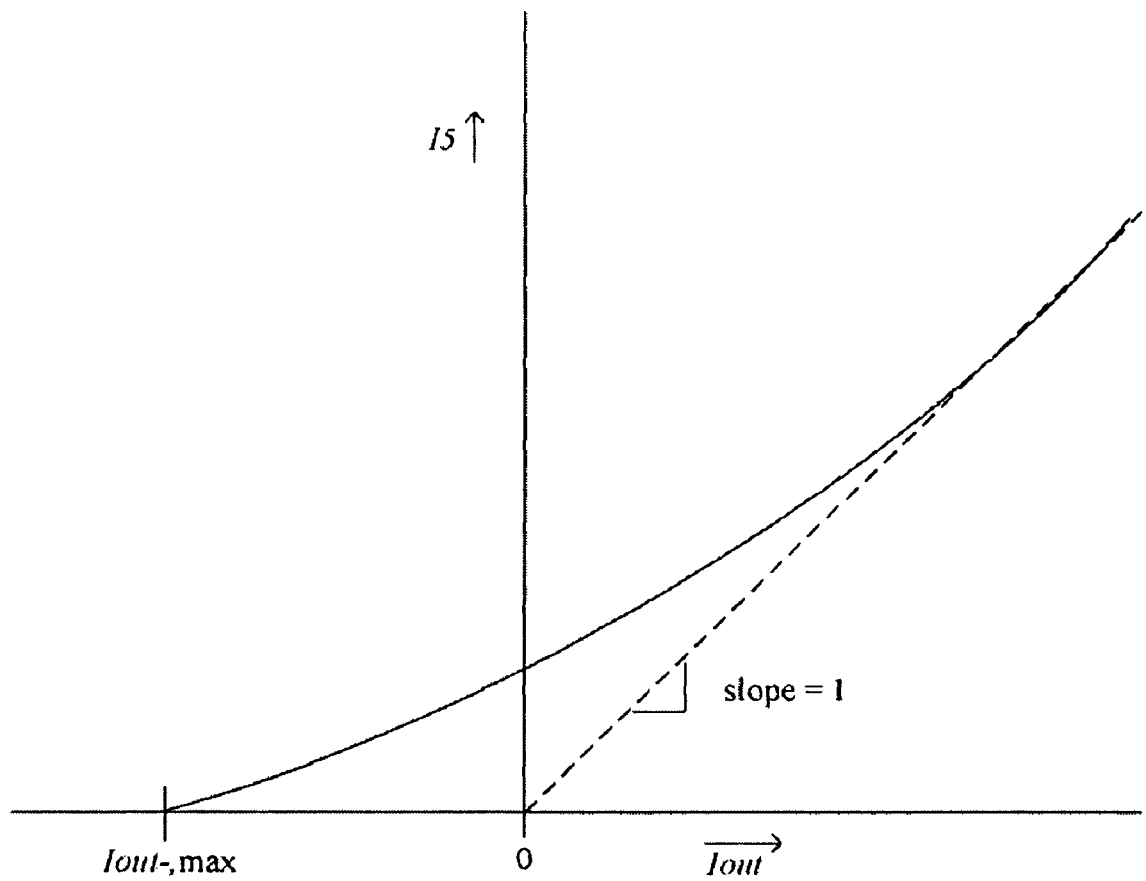
FIG. 2 is a graph showing the relationship for currents I5 and Iout in the circuits of FIGS. 1A, 1B and 1C.

The general action of an output sourcing current is to reduce the emitter current of transistor Q4. Transistor Q5 then just sources the output current, and at large output currents transistor Q4 and the current mirror 120 smoothly approach turn-off. The translinear action of transistors Q2 and Q4 provide for this smoothness. FIG. 2 shows the relationship between the output current Iout and current I5.

For Iout being a sinking current, transistor Q5 gradually turns off and stops diverting current from transistor Q4. The current mirror 120 sinks more and more output, but transistor Q5 remains substantially on, controlling the output voltage even though it may be conducting less current than the output of the current mirror 120. Eventually, a large enough output is sunk that transistor Q5 is turned off, at which point current I5=0, and Iout–, max (the maximum sink current the circuit can provide) is as follows:

$$Iout-, max = A * Ibias * \sqrt{\frac{Is2 * Is4}{Is1 * Is3}}. \qquad \text{(Equation 2)}$$

An advantage to the circuit of FIG. 1 is that Iout–, max is not a class-A standing current that creates a large I5 quiescent, with the relationship of I5,quiescent and Iout–, max shown below:

$$Iout-,max=I5,\text{quiescent}*\sqrt{A+1} \qquad \text{(Equation 3)}.$$

Referring to FIG. 1A, it can be seen that transistors Q1 and Q3 are diode-connected, as mentioned above, and biased with Ibias. If Iout=0, then transistor Q5 will output a current proportional to Ibias, and a function of the areas of Q1-Q4. Assuming Iout=0, then the current I5 will be very close to A*I4. Current I5 acts to diminish current I4 by diverting current from the emitter of transistor Q4, with I5,quiescent being shown below:

$$I5, quiescent = Ibias * \sqrt{\left(\left(\frac{Is2 * Is4}{Is1 * Is3}\right) * \frac{A^2}{1+A}\right)}. \qquad \text{(Equation 4)}$$

In one extreme case, when the output load draws sufficient current, transistor Q2 turns on as a diode to source the majority of the current. In doing so, the $V_{BE}$ of transistor Q2 increases, shutting off transistor Q4 below it, resulting in the current mirror 120 being turned off. In the opposite extreme case, when the output load is pushing sufficient current into the output stage 102, the current mirror 120 will absorb this current, shutting off the output transistor Q5. In this situation, all the current from transistor Q2 will flow through the transistor Q4 to bias the current mirror 120.

This translinear bias arrangement of the translinear current controller 110 allows for smooth transitions between these two extreme states with a good overlap region in which the topside currents (sourcing from the transistor Q2) and the low side currents (sourcing from the current mirror 120) simultaneously flow through the output transistor Q5. This is by definition a class-AB bias stage, which is useful for low distortion wide band signals.

In FIG. 1A, the base and collector transistor Q1 are connected together, as is also the case for transistors Q2 and Q3. When connected in this manner, transistors are considered to be diode connected, since they generally function as diodes, with the connected together base and collector forming the anode, and the emitter forming the cathode.

Figure 1B:
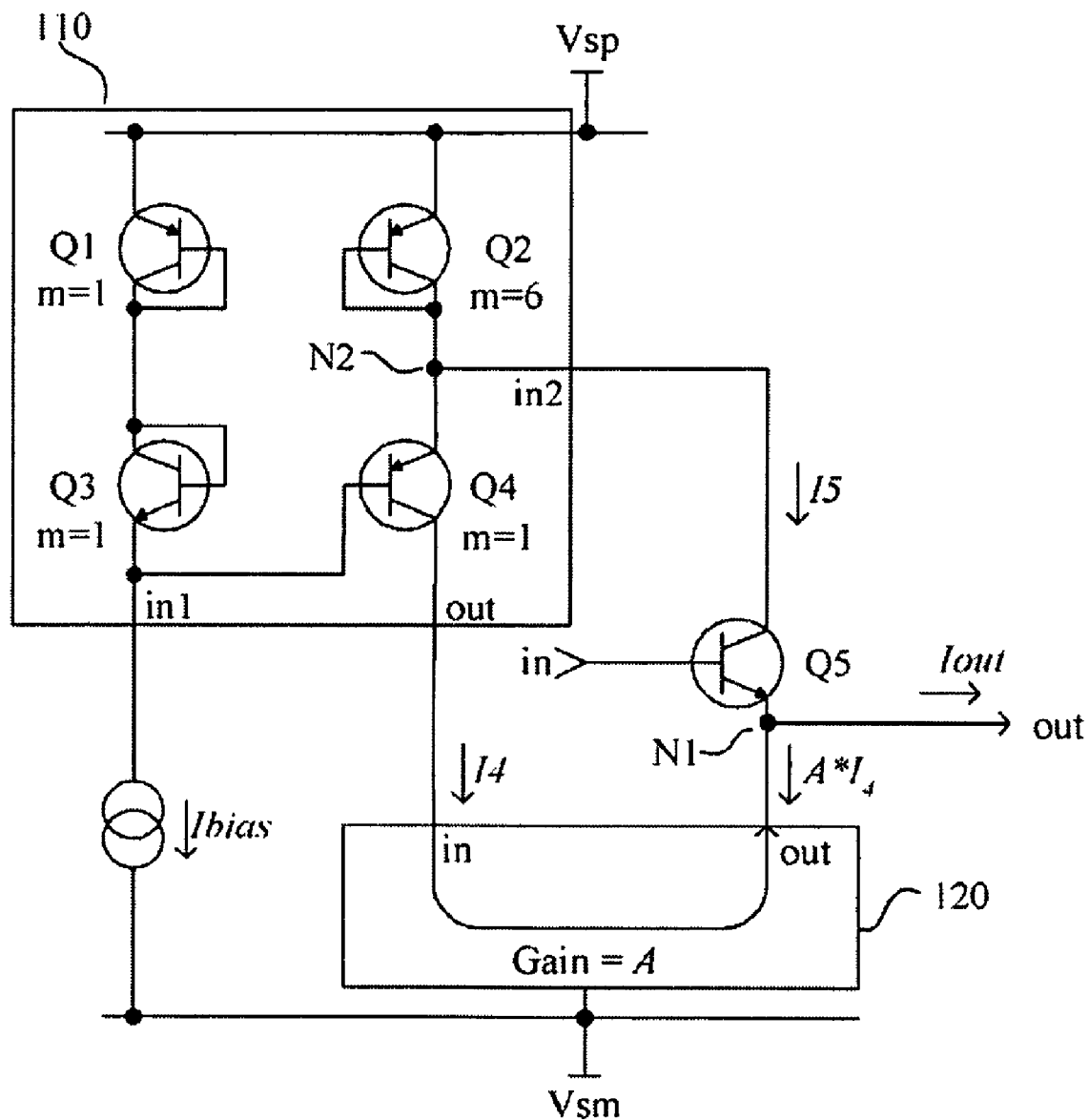

Since transistor Q1 in FIG. 1A is acting as a diode, the diode connected NPN transistor Q1 can be replaced with a diode connected PNP transistor, as shown in FIG. 1B. Similarly, the diode connected NPN transistor Q2 of FIG. 1A can be replaced with a diode connected PNP transistor, as also shown in FIG. 1B. Additionally, the diode connected PNP transistor Q3 of FIG. 1A can be replaced with a diode connected NPN transistor, as shown in FIG. 1B. Any and all such replacements are within the scope of the present invention.

Figure 1C:
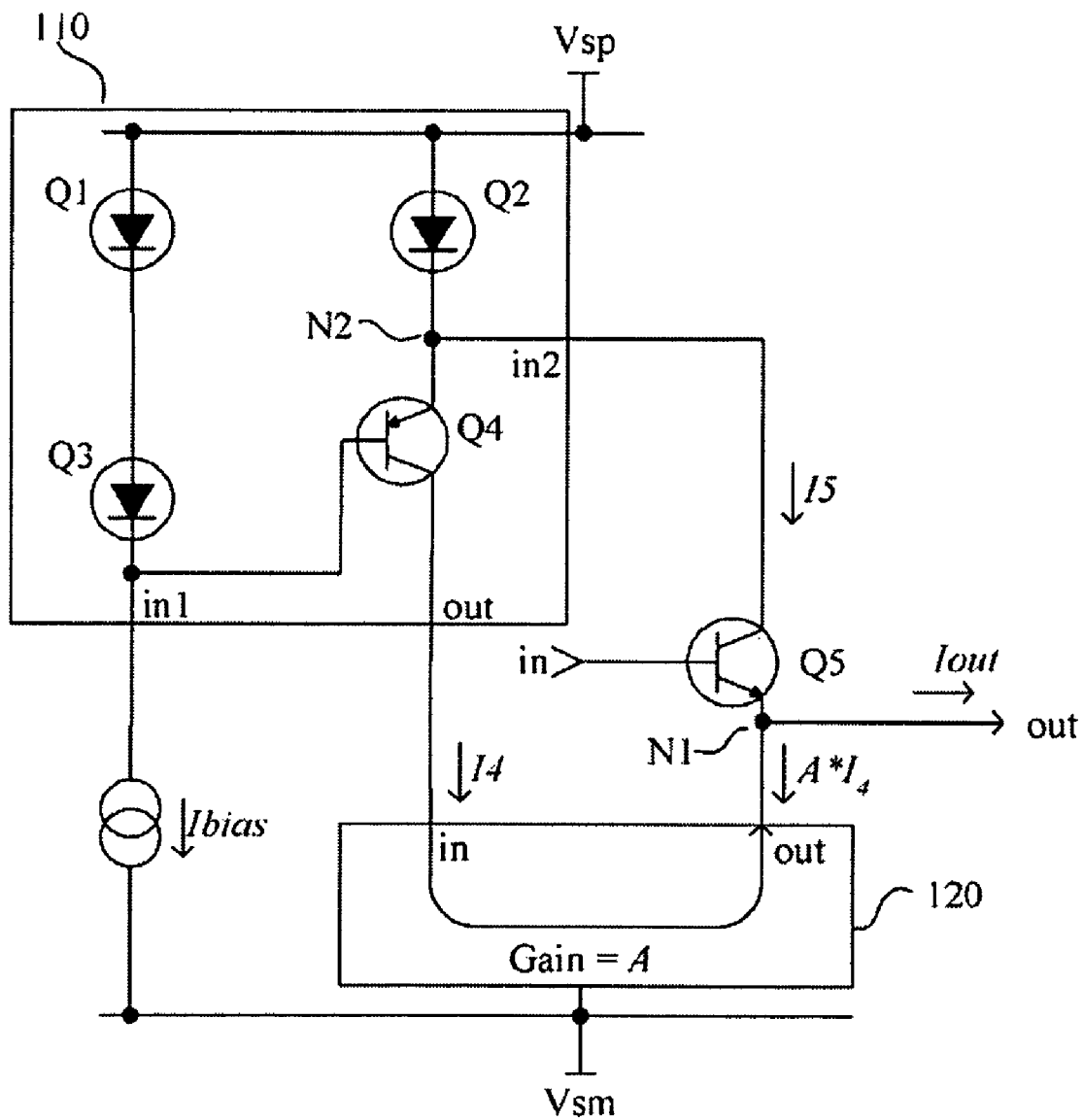

Since transistors Q1, Q2 and Q3 are acting as diodes in FIGS. 1A and 1B, it is also within the scope of the present invention to replace these transistors with discrete diodes, as shown in FIG. 1C, or with any other device that is connected to function as a diode. Diode connected transistors, or any other device that functions as a diode, including a discrete diode, is referred to hereafter as a diode device.

The current mirror 120 is preferably implemented using CMOS transistors, because CMOS transistors do not saturate like bipolar transistors, CMOS transistors can operate close to zero volts, and CMOS transistors have better recovery time. However, in an alternative embodiment, the current mirror 120 can be implemented using bipolar transistors.

In addition to the output stage 102 not being restricted to the exact device types shown, components can be added as desired to increase stability of the circuit.

While not limited to such uses, the output stage of the present invention is especially useful for driving low voltage video circuits.

In the FIG. 1A transistors Q1, Q2 and Q5 are shown as being bipolar NPN (i.e., N-channel) transistors, and transistors Q3 and Q4 are shown as being bipolar PNP (i.e., P-channel) transistors. However, in accordance with alternative embodiments of the present invention, the transistors, current sources, and supply polarities can all be inverted together with no alteration to circuit behavior. More specifically, transistors Q1, Q2 and Q5 can be PNP transistors, and transistors Q3 and Q4 can be NPN transistors.

Figure 3:
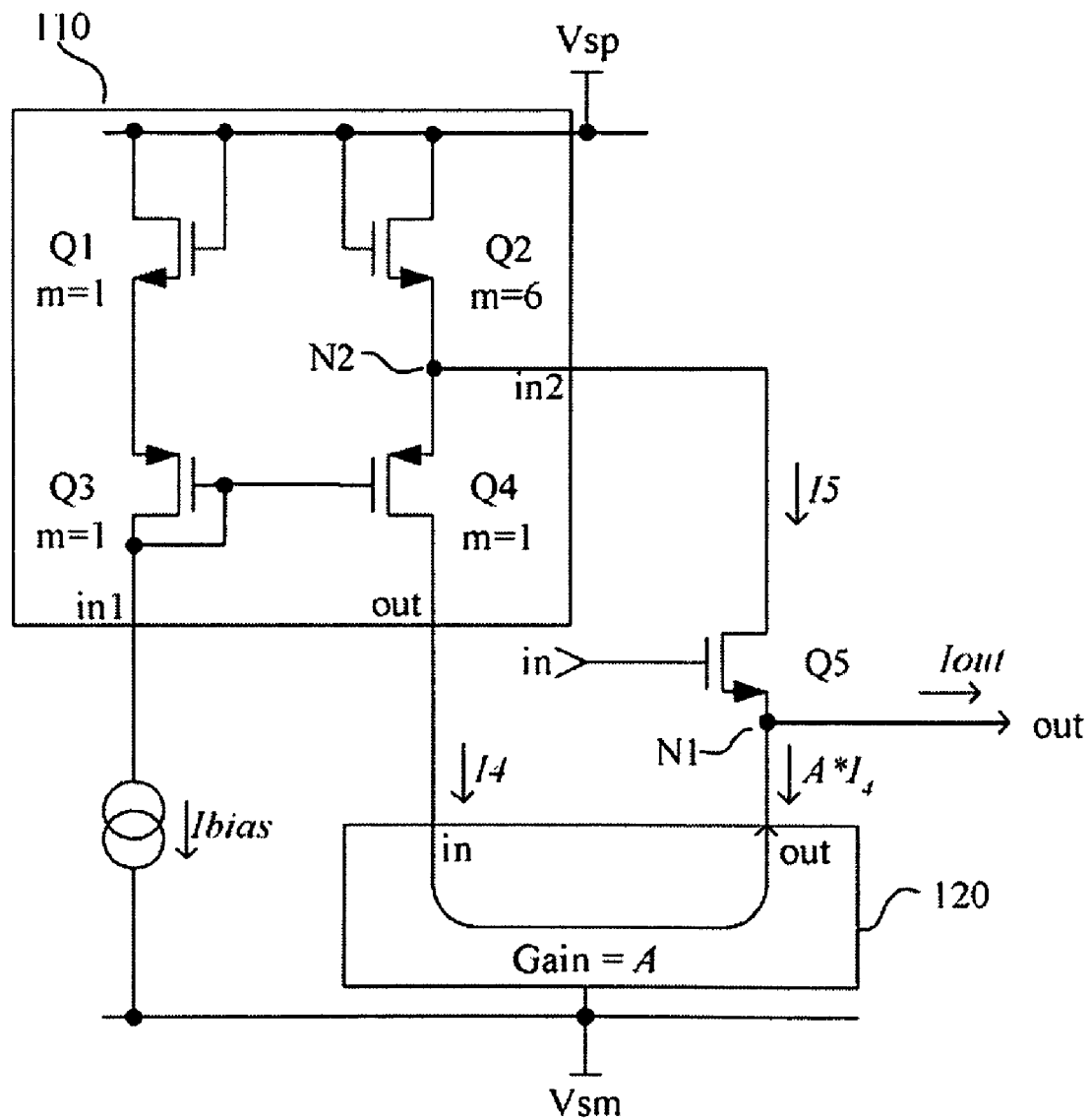
FIG. 3 is a circuit diagram of an output stage according to another embodiment of the present invention.

The above described equations would stay the same, even if output transistor Q5 were replaced with an equivalent MOS device. In further embodiments, all of the transistors Q1-Q5 are replaced with MOS devices, as shown in FIG. 3. The output stage 102' shown in FIG. 3 would function similarly to the output stage 102 of FIG. 1, but the equations used to explain the circuits would differ. In still another embodiment, transistors Q1-Q4 can be MOS devices, e.g., as shown in FIG. 3, while the output transistor Q5 is a bipolar device, e.g., as shown in FIG. 1.

It is also within the scope of the present invention that the metal semiconductor (MES) transistors can be used in place of MOS transistors.

As would be appreciated by one of ordinary skill in the art, the transistors that make up the current mirror 110 can be simple uncascoded transistors. It is also possible that the transistors of the current mirror 110 be cascoded to reduce offset errors and power supply variation sensitivity.

Exemplary ratios of transistors Q1-Q4 are shown in FIGS. 1A, 1B and 3. However, other ratios are also within the scope of the present invention, and thus, the ratios shown are not meant to be limiting.

The forgoing description is of the preferred embodiments of the present invention. These embodiments have been provided for the purposes of illustration and description, but are not intended to be exhaustive or to limit the invention to the precise forms disclosed. Many modifications and variations will be apparent to a practitioner skilled in the art. Embodiments were chosen and described in order to best describe the principles of the invention and its practical application, thereby enabling others skilled in the art to understand the invention. Slight modifications and variations are believed to be within the spirit and scope of the present invention. It is intended that the scope of the invention be defined by the following claims and their equivalents.

What is claimed is:

1. An output stage, comprising:
   a current controller (110), that operates in accordance with the translinear principle, including a first input (in1), a second input (in2) and an output;
   a current mirror (120) including an input and an output; and
   an output transistor (Q5) including a control terminal and a current path including a first terminal and a second terminal;
   wherein the control terminal of the output transistor (Q5) forms an input of the output stage;
   wherein the first current path terminal of the output transistor (Q5) is connected to the second input (in2) of the current controller (110);
   wherein the second current path terminal of the output transistor (Q5) forms an output of the output stage, and is connected to the output of the current mirror (120);
   wherein the first input (in1) of the current controller (110) is connected to a bias current source (Ibias); and
   wherein the output of the current controller (110) is connected to the input of the current mirror (120).

2. The output stage of claim 1, wherein the current controller (110), that operates in accordance with the translinear principle, includes four transistors, three of which are diode connected, and one of which is not diode connected.

3. The output stage of claim 2, wherein the transistor of the current controller (110) that is not diode connected includes:
   a control terminal that forms the first input (in1) of the current controller (110);
   a first current path terminal that forms the output of the current controller (110); and
   a second current path terminal that forms the second input (in2) of the current controller (110).

4. The output stage of claim 2, wherein the four transistors, of the current controller (110), include:
   a first diode connected transistor (Q1) including a control terminal and a current path including a first terminal and a second terminal, the first current path terminal of the first transistor (Q1) connected to a first voltage rail, and the control terminal of the first transistor (Q1) connected to one of the first and second current path terminals of the first transistor (Q1);
   a second diode connected transistor (Q2) including a control terminal and a current path including a first terminal and a second terminal, the first current path terminal of the second transistor (Q2) connected to the first voltage rail, and the control terminal of the second transistor (Q2) connected to one of the first and second current path terminals of the second transistor (Q2);
   a third diode connected transistor (Q3) including a control terminal and a current path including a first terminal and a second terminal, the second current path terminal of the third transistor (Q3) connected the second current path terminal of the first transistor (Q1), and the control terminal of the third transistor (Q3) connected one of the first and second current path terminals of the third transistor (Q3); and
   a fourth transistor (Q4), which is not diode connected, including a control terminal and a current path including a first terminal and a second terminal, the second current path terminal of the fourth transistor (Q4) connected the second current path terminal of the second transistor (Q2), and the control terminal of the fourth transistor (Q4) connected to the first current path terminal of the third transistor (Q3).

5. The output stage of claim 4, wherein:
   the control terminal of the fourth transistor (Q4) forms the first input (in1) of the current controller (110);
   the first current path terminal of the fourth transistor (Q4) forms the output of the current controller (110); and
   the second current path terminal of the fourth transistor (Q4) forms the second input (in2) of the current controller (110).

6. The output stage of claim 5, wherein translinear action of the second transistor (Q2) and the fourth transistor (Q4) provides for a smooth relationship between an output current (Iout) produced at the output of the output stage and a current at the first current path terminal of the output transistor (Q5).

7. The output stage of claim 5, wherein:
   the bias current source (Ibias) is connected between the first input (in1) of the current controller (110) and a second voltage rail; and
   the current mirror is connected to the second voltage rail.

8. The output stage of claim 7, wherein the second voltage rail is ground.

9. The output stage of claim 1, wherein the current controller (110) includes three diode devices and a transistor, the transistor including:
   a control terminal of that forms the first input (in1) of the current controller (110);

a first current path terminal that forms the output of the current controller (110); and a second current path terminal that forms the first input (in2) of the current controller (110).

10. The output stage of claim 9, wherein the three diode devices, of the current controller (110), include:

a first diode device (Q1) including an anode and a cathode, the anode connected to a first voltage rail;

a second diode device (Q2) including an anode and a cathode, the anode of the second diode device (Q2) connected to the first voltage rail, the cathode of the second diode device (Q2) connected to the second input (in2) of the current controller (110); and a third diode device (Q3) including an anode and a cathode, the anode of the third diode device (Q3) connected to the cathode of the first diode device (Q1), the cathode of the third diode device (Q3) connected to the first input (in1) of the current controller (110).

11. The output stage of claim 10, wherein:

the bias current source (Ibias) is connected between the first input (in1) of the current controller (110) and a second voltage rail; and the current mirror is connected to the second voltage rail.

12. The output stage of claim 11, wherein the second voltage rail is ground.

13. The output stage of claim 1, wherein the current controller (110), that operates in accordance with the translinear principle, includes multiple transistors.

14. The output stage of claim 13, wherein one of the multiple transistors of the current controller (110) is the output transistor of the current controller (110), and where the output transistor of the current controller (110) includes:

a control terminal that forms the first input (in1) of the current controller (110);

a first current path terminal that forms the output of the current controller (110); and a second current path terminal that forms the second input (in2) of the current controller (110).

15. A method for biasing an output transistor (Q5) of an output stage, the output transistor (Q5) including a control terminal and a current path including a first terminal and a second terminal, where the control terminal of the output transistor (Q5) forms an input of the output stage, and the second current path terminal of the output transistor (Q5) forms an output of the output stage, the method comprising:

operating a current controller (110) in accordance with the translinear principle;

generating a first current (I5) using the current controller (110) and providing the first current (I5) to the first current path terminal of the output transistor (Q5); and generating a second current (I4) using the current controller (110) and sinking an amplified version of the second current (A*I4) from the second current path terminal of the output transistor (Q5).

16. The method of claim 15, further comprising:

using a current mirror (120) to sink the amplified version of the second current (A*I4) from the second current path terminal of the output transistor (Q5).

17. The method of claim 16, wherein the using the current mirror (120) comprises providing the second current (I4) to an input of the current mirror, where the current mirror has a gain (A), and where an output of the current mirror is connected to the second current path terminal of the output transistor (Q5).

18. An output stage, comprising:

a current controller (110), that operates in accordance with the translinear principle, the current controller (110) consisting of multiple transistors all except one of which are diode connected, wherein the one transistor of the current controller (110) that is not diode connected includes a control terminal that forms a first input (in1) of the current controller (110), a first current path terminal that forms an output of the current controller (110), and a second current path terminal that forms a second input (in2) of the current controller (110);

a current mirror (120) that includes an input and an output; and an output transistor (Q5) that includes a control terminal that forms an input of the output stage, a first current path terminal that is connected to the second input (in2) of the current controller (110), and a second current path terminal that forms an output of the output stage and is connected to the output of the current mirror (120).

19. The output stage of claim 18, wherein:

the first input (in1) of the current controller (110) is connected to a bias current source (Ibias); and the output of the current controller (110) is connected to the input of the current mirror (120).

20. The output stage of claim 19, wherein:

the current controller (110) is connected to a first voltage rail;

the bias current source (Ibias) is connected between the first input (in1) of the current controller (110) and a second voltage rail; and the current mirror is connected to the second voltage rail.

21. The output stage of claim 20, wherein the second voltage rail is ground.

* * * * *

UNITED STATES PATENT AND TRADEMARK OFFICE
CERTIFICATE OF CORRECTION

| | |
|---|---|
| PATENT NO. | : 7,898,336 B2 |
| APPLICATION NO. | : 12/325448 |
| DATED | : March 1, 2011 |
| INVENTOR(S) | : Robert David Zucker and Barry Harvey |

It is certified that error appears in the above-identified patent and that said Letters Patent is hereby corrected as shown below:

Title page, Assignee: item (73), replace "D2Audio Corporation" with --Intersil Americas Inc.--.

Signed and Sealed this
Twenty-second Day of October, 2013

Teresa Stanek Rea
*Deputy Director of the United States Patent and Trademark Office*